(12) United States Patent
Chang-Chien et al.

(10) Patent No.: US 7,919,839 B2
(45) Date of Patent: Apr. 5, 2011

(54) SUPPORT STRUCTURES FOR ON-WAFER TESTING OF WAFER-LEVEL PACKAGES AND MULTIPLE WAFER STACKED STRUCTURES

(75) Inventors: Patty Pei-Ling Chang-Chien, Redondo Beach, CA (US); Kelly Jill Tornquist Hennig, Torrance, CA (US)

(73) Assignee: Northrop Grumman Systems Corporation, Los Angeles, CA (US)

( * ) Notice: Subject to any disclaimer, the term of this patent is extended or adjusted under 35 U.S.C. 154(b) by 923 days.

(21) Appl. No.: 11/782,497

(22) Filed: Jul. 24, 2007

(65) Prior Publication Data
US 2009/0026627 A1    Jan. 29, 2009

(51) Int. Cl.
*H01L 23/02* (2006.01)

(52) U.S. Cl. .................. 257/678; 257/774; 257/E21.59; 257/48

(58) Field of Classification Search .................. 257/678, 257/774, 48
See application file for complete search history.

(56) References Cited

U.S. PATENT DOCUMENTS

| | | | |
|---|---|---|---|
| 4,755,910 A | 7/1988 | Val | |
| 5,056,215 A | 10/1991 | Blanton | |
| 5,757,072 A | 5/1998 | Gorowitz et al. | |
| 6,028,437 A | 2/2000 | Potter | |
| 6,232,662 B1 | 5/2001 | Saran | |
| 6,625,882 B1 | 9/2003 | Saran et al. | |
| 6,687,989 B1 | 2/2004 | Farnworth et al. | |
| 6,777,263 B1 | 8/2004 | Gan et al. | |
| 6,890,828 B2 | 5/2005 | Horak et al. | |
| 6,949,807 B2 | 9/2005 | Eskridge et al. | |
| 6,960,836 B2 | 11/2005 | Bachman et al. | |
| 6,965,168 B2 | 11/2005 | Langhorn | |
| 7,067,397 B1 | 6/2006 | Chang-Chien et al. | |
| 7,067,902 B2 | 6/2006 | Hichri et al. | |
| 7,132,736 B2 | 11/2006 | Bakir et al. | |
| 2004/0012403 A1 | 1/2004 | Richmond, II et al. | |
| 2006/0249857 A1 | 11/2006 | Haba et al. | |

FOREIGN PATENT DOCUMENTS

JP    2005236277    9/2005

*Primary Examiner* — Roy K Potter
(74) *Attorney, Agent, or Firm* — John A. Miller; Miller IP Group, PLC

(57) ABSTRACT

A semiconductor structure, such as a wafer-level package or a vertically stacked structure. The wafer-level package includes a substrate wafer on which an integrated circuit is formed. A cover wafer is bonded to the substrate wafer to provide a cavity between the substrate wafer and the cover wafer in which the integrated circuit is hermetically sealed. Vias are formed through the substrate wafer and make electrical contact with signal and ground traces formed on the substrate wafer within the cavity, where the traces are electrically coupled to the integrated circuit. Probe pads are formed on the substrate wafer outside of the cavity and are in electrical contact with the vias. A support post is provided directly beneath the probe pad so that when pressure is applied to the probe pad from the probe for testing purposes, the support post prevents the substrate wafer from flexing and being damaged.

20 Claims, 3 Drawing Sheets

SUPPORT STRUCTURES FOR ON-WAFER TESTING OF WAFER-LEVEL PACKAGES AND MULTIPLE WAFER STACKED STRUCTURES

BACKGROUND OF THE INVENTION

1. Field of the Invention

This invention relates generally to wafer-level packages and multiple vertically stacked semiconductor structures for integrated circuits and, more particularly, to a wafer-level packages and multiple vertically stacked semiconductor structures for integrated circuits that includes a support structure positioned relative to a probe pad so as to prevent wafer damage during circuit testing.

2. Discussion of the Related Art

It is known in the art to provide wafer-level packages for integrated circuits, such as monolithic millimeter-wave integrated circuits (MMIC), formed on substrate wafers. In one wafer-level packaging design, a cover wafer is mounted to the substrate wafer using a bonding ring so as to provide a hermetically sealed cavity in which the integrated circuit is provided. Typically, many integrated circuits are formed on the substrate wafer and covered by a single cover wafer, where each integrated circuit is surrounded by a separate bonding ring. The cover wafer and the substrate are then diced between the bonding rings to separate the packages for each separate integrated circuit. The dicing process typically requires the use of a saw that cuts the cover wafer between the packages where a portion of the cover wafer is removed. The substrate wafer is then cut between the packages.

For certain wafer-level packaging designs, vias are provided through the substrate wafer that make electrical contact with signal lines and ground lines electrically coupled to the integrated circuit within the cavity. Probe pads formed on top of the substrate wafer are electrically coupled to certain ones of the vias opposite to the cavities, and a probe is electrically coupled to the probe pads so as to test the integrated circuit for performance purposes. The probe is typically part of a probe assembly, where the probe assembly can include multiple signal and/or ground probes or a combination of the two. The probe assembly is connected to a machine that automatically moves the probe assembly across the substrate wafer to provide electrical contact to a certain group of the probe pads for testing purposes.

The probe assembly applies a force to the substrate wafer to make a suitable electrical contact thereto. Because the substrate wafer is relatively thin, the force typically causes the substrate to flex, and may cause the substrate wafer to crack, thus affecting the hermetical seal of the cavity and the integrity of the wafer-level package.

SUMMARY OF THE INVENTION

In accordance with the teachings of the present invention, a semiconductor structure for supporting one or more integrated circuits is disclosed. The semiconductor structure can be any suitable structure, such as a wafer-level package or a multiple vertically stacked semiconductor structure. The wafer-level package includes a substrate wafer on which the integrated circuits are formed. A cover wafer is bonded to the substrate wafer to provide a cavity between the substrate wafer and the cover wafer in which the integrated circuits are hermetically sealed. Vias are formed through the substrate wafer and make electrical contact with signal and ground traces formed on the substrate wafer within the cavity, where the traces are electrically coupled to the integrated circuits. Probe pads are formed on the substrate wafer outside of the cavity and are in electrical contact with the vias. A support post is provided directly beneath the probe pad so that when pressure is applied to the probe pad from the probe for testing purposes, the support post prevents the substrate wafer from flexing and being damaged. For the multiple stacked structure, supporting posts or structures are placed between each of the substrates in close proximity to the probe pads to vertically support the probe pads located on the top most wafer.

Additional features of the present invention will become apparent from the following description and appended claims, taken in conjunction with the accompanying drawings.

DETAILED DESCRIPTION OF THE EMBODIMENTS

The following discussion of the embodiments of the invention directed to wafer-level packages and multiple vertically stacked semiconductor structures including a support post for a test probe pad is merely exemplary in nature, and is in no way intended to limit the invention or its applications or uses.

Figure 1:
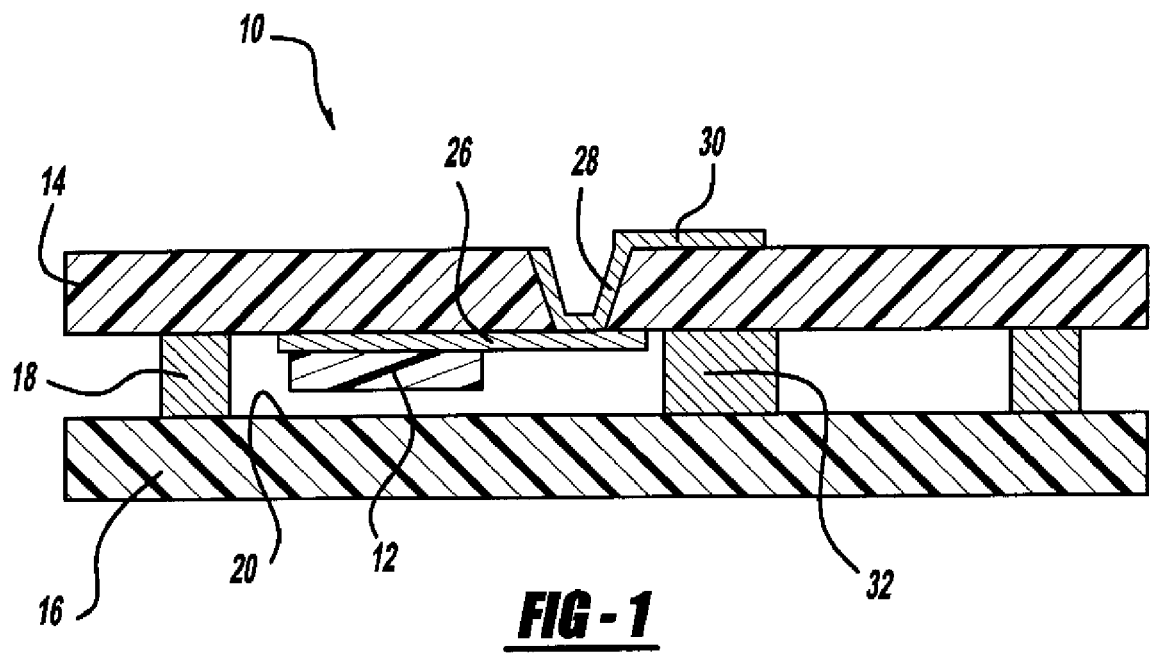
FIG. 1 is a cross-sectional view of a wafer-level package employing a probe pad support post, according to an embodiment of the present invention.
Figure 2:
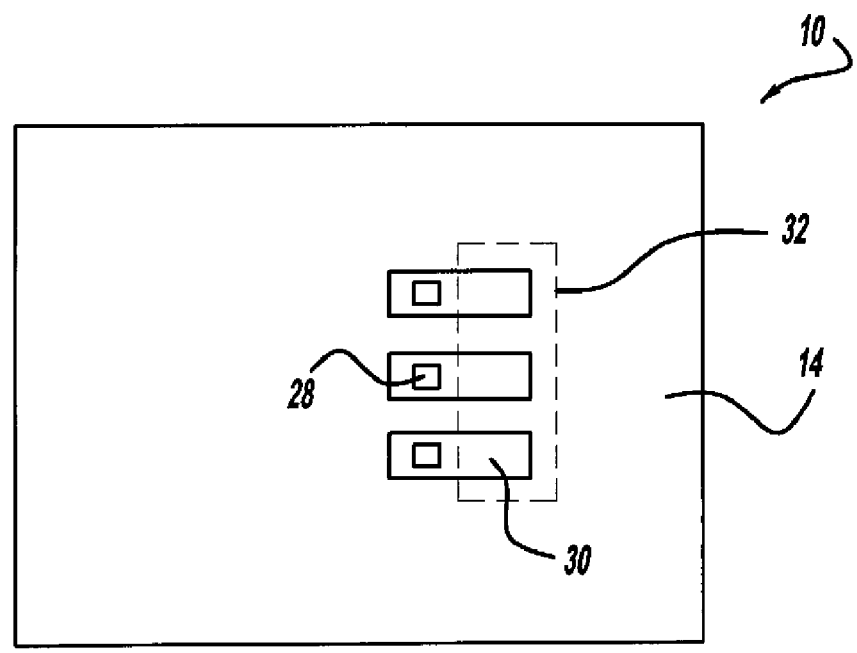
FIG. 2 is a top view of the wafer-level package shown in FIG. 1 including a three probe assembly.

FIG. 1 is a cross-sectional view and FIG. 2 is a top view of a wafer-level package 10 for enclosing one or more integrated circuits 12. The wafer-level package 10 includes a substrate wafer 14 on which the integrated circuit 12 is formed. The substrate wafer 14 can be any suitable semiconductor wafer, such as group III-V semiconductors, silicon, etc. Further, the substrate wafer 14 can have any suitable thickness, such as 100 µm. In other embodiments, the substrate wafer 14 can have other thicknesses, such as hundreds of microns, 75 µm, 50 µm, etc. Also, the integrated circuit 12 can be any suitable circuit device for wafer-level packaging, such as MMICs, filters, amplifiers, analog-to-digital converters, mixers, phase-shifters, etc.

Another wafer, such as a cover wafer 16, is bonded to the substrate wafer 14 by a bonding ring 18 and forms a hermetically sealed cavity 20 in which the integrated circuit 12 is positioned, as is well understood in the art. The cover wafer 16 can be made of any suitable material, such as glass, silicon, III-V semiconductor substrates, etc., and can have any suitable thickness. In one non-limiting embodiment, a gold ring is provided on the substrate wafer 14 and a bonding layer is deposited on the gold ring. Likewise, a matching gold ring is patterned on the cover wafer 16. A low temperature process is employed to bond the substrate wafer 14 to the cover wafer 16, where the bonding layer is combined to form the bonding ring 18. Although a single integrated circuit 12 is shown formed to the substrate wafer 14, multiple integrated circuits may be provided within the cavity 20 on the substrate wafer 14 by fabrication processes well understood to those skilled in the art. Additionally, the cover wafer 16 can be another substrate wafer on which integrated circuits are formed.

Electrical traces 26, such as gold traces, are patterned on the substrate wafer 14, and are electrically coupled to components in the integrated circuit 12. The traces 26 are intended to represent signal traces and ground traces necessary for the integrated circuit components within the circuit 12, and can be in any suitable trace configuration, such as coplanar waveguides and microstrip lines.

In this embodiment, connection to the traces 26 is made vertically by vias 28 formed through the substrate wafer 14. A probe pad 30 is electrically coupled to the via 28 on top of the wafer 14, where each signal trace and ground trace includes a separate via. During wafer-level packaging batch integration processes, the integrated circuit 12 is tested by coupling a probe assembly to the probe pads 30 and providing signals to and receiving signals from the integrated circuit 12. As discussed above, the probe applies a force to the substrate wafer 14. In this embodiment, a probe pad 30 is provided for two ground vias and a signal via, where the ground vias are electrically isolated from the signal via. A three-finger probe assembly will automatically move across the wafer 14 during batch integration of several of the wafer-level packages to test the integrated circuit 12 within each package 10.

According to the invention, one or more support posts 32 are provided between the substrate wafer 14 and the cover wafer 16 directly beneath the probe pads 30 to prevent the substrate wafer 14 from bending or flexing during testing. In this non-limiting embodiment, the support post 32 has a suitable size and shape for all three of the probe pads 30 shown, such as a rectangular shape. Alternately, a separate support post can be provided for each separate probe pad 30. In this embodiment, the support post 32 is formed at the same time as the bonding ring 18. Therefore, the support post 32 includes the gold layers and the bonding layer. In alternate embodiments, the support post 32 can be made of any suitable material, not necessarily the same material as the bonding ring 18, and can be deposited by any suitable manufacturing steps.

Figure 3:
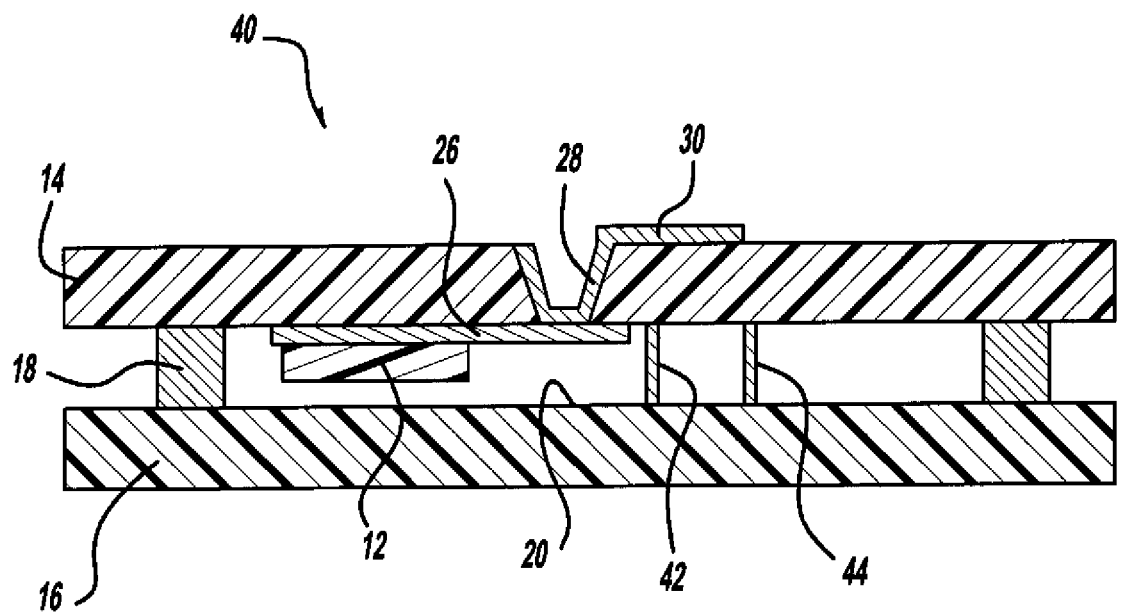
FIG. 3 is a cross-sectional view of a wafer-level package employing a plurality of pillars for providing probe pad support, according to another embodiment of the present invention.

In certain wafer-level packaging designs, the position and configuration of the various integrated circuits 12 and the traces 26 may limit the space within the cavity 20. Therefore, the size of the support post 32 suitable for a particular probe pad or array of the probe pads 30 may be too large for the particular circuit design. FIG. 3 is a cross-sectional view of a wafer-level package 40 where like elements to the wafer-level package 10 are identified by the same reference numeral. In this embodiment, the support post 32 is replaced with a plurality of support pillars 42 and 44 positioned directly beneath the probe pad 30 so as to allow specialized placement of the support pillars 42 and 44 around the various circuit elements that may be within the cavity 20. The support pillars 42 and 44 can be cylindrical pillars having a diameter that meets the needs as described herein.

Figure 4:
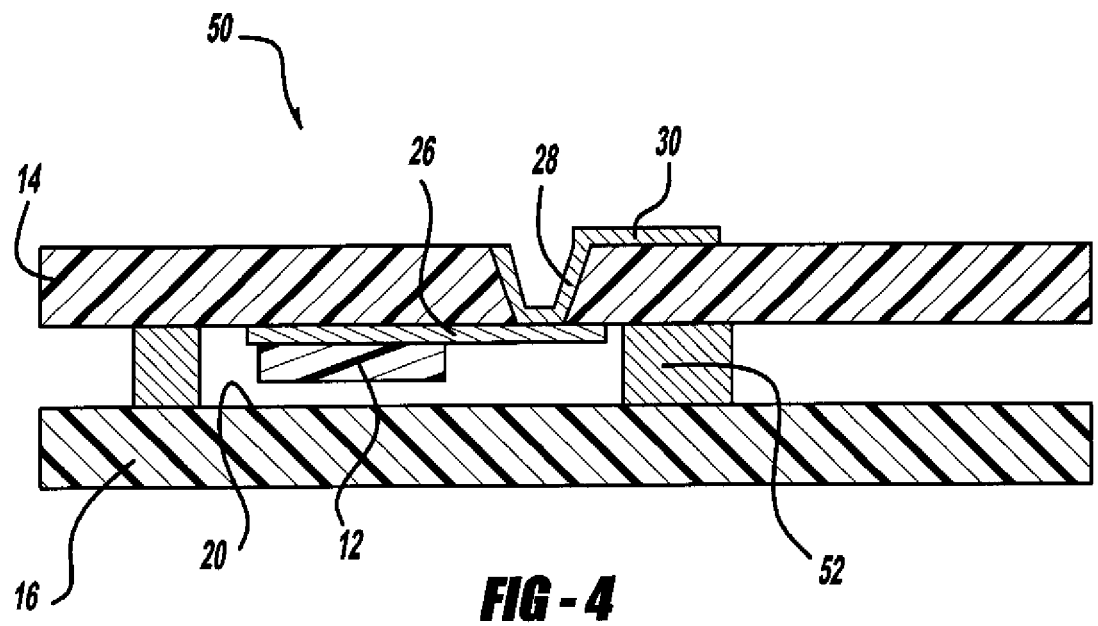
FIG. 4 is a cross-sectional view of a wafer-level package including a bonding ring being used as a probe pad support structure, according to another embodiment of the present invention.

According to another embodiment of the present invention, the bonding ring itself is used as the support for the probe pad 30. FIG. 4 is a cross-sectional view of a wafer-level package 50 including a bonding ring 52 showing this embodiment of the invention, where like elements to the package 10 are identified by the same reference numeral. The bonding ring 52 is positioned directly below the probe pads 30 to provide the desired probe pad support. In order to provide this support, the size of the bonding ring 52 may be made wider at least at the areas directly below the probe pads 30 over that of other bonding rings, such as the bonding ring 18.

The discussion above specifically describes using a support structure within a wafer-level package. However, the use of such support structures can be extended to other semiconductor structures, such as multiple vertically stacked semiconductor structures that may or may not be hermetically sealed.

Figure 5:
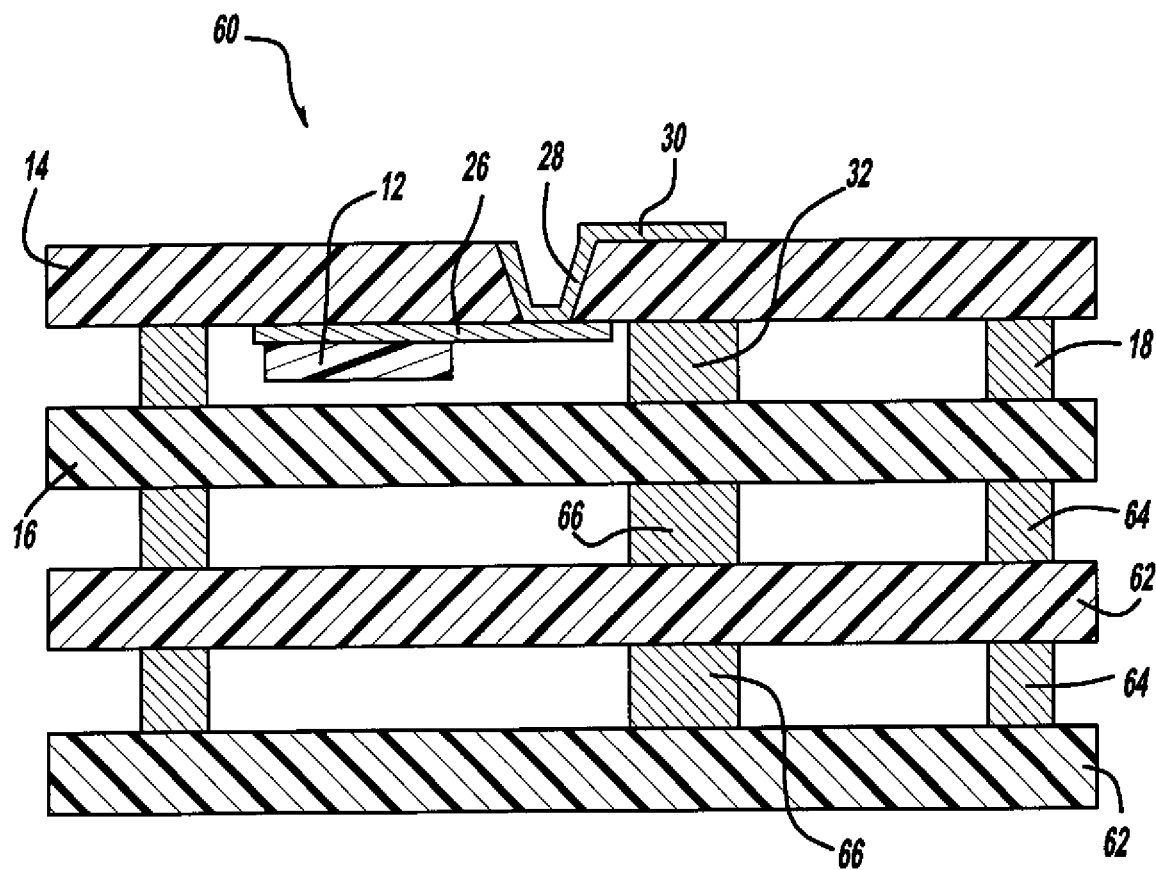
FIG. 5 is a cross-sectional view of a multiple vertically stacked semiconductor structure employing probe pad support posts between substrates, according to another embodiment of the present invention.

FIG. 5 is a cross-sectional view of a multiple vertically stacked semiconductor structure 60 showing this embodiment of the invention, where like elements to the package 10 are identified by the same reference numeral. In this embodiment, multiple stacked wafers 62 are provided in addition to the substrate wafer 16 and the cover wafer 14 that define cavities and enclosures for other integrated circuits. The stacked structure 60 can include semiconductor wafers, cover wafers and can be hermetically sealed or not. In this embodiment, additional bonding rings 64 are provided to bind the plurality of vertically stacked wafers 62, and additional support posts 66 are provided beneath the probe pad 30 to provide the support for all of the wafers 62.

In alternate embodiments, the structure 60 can employ the support pillars 42 and 44 and can use the bonding ring 18 as the support structure, in the manner as discussed above.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A semiconductor structure comprising:
   at least one substrate wafer having a first side and a second side, said at least one substrate wafer including at least one integrated circuit and a plurality of electrical traces formed on the first side of the at least one substrate wafer, said at least one substrate wafer further including a plurality of vias extending through the at least one substrate wafer and making electrical contact with the traces, said at least one substrate wafer further including a plurality of probe pads provided on the second surface of the at least one substrate wafer each being in electrical contact with a via;
   a cover wafer bonded to the at least one substrate wafer so as to define a cavity in which the at least one integrated circuit is provided; and
   at least one support post being positioned within the cavity directly opposite to a probe pad, said support post providing support to resist flexing of the at least one substrate wafer in response to pressure being applied to the probe pad.

2. The semiconductor structure according to claim 1 wherein the at least one support post is a plurality of support posts each being positioned directly beneath the probe pads.

3. The semiconductor structure according to claim 2 wherein the plurality of support posts are cylindrical pillars.

4. The semiconductor structure according to claim 1 wherein the at least one support post includes at least a certain length of a bonding ring that bonds the at least one substrate wafer to the cover wafer.

5. The semiconductor structure according to claim 1 wherein the at least one support post is made of the same material as a bonding ring that bonds the at least one support wafer to the cover wafer.

6. The semiconductor structure according to claim 1 wherein the at least one support post is positioned directly beneath three probe pads including two ground pads and a signal pad.

7. The semiconductor structure according to claim 1 wherein the support structure is a wafer-level package and the cavity is a hermetically sealed cavity.

8. The semiconductor structure according to claim 1 wherein the at least one substrate wafer is a plurality of substrate wafers spaced apart from each other defining a multiple vertically stacked structure including cavities between the plurality of wafers, and wherein the at least one support post includes at least one support post positioned within each cavity in alignment with the probe pad so as to provide support to resist flexing of the plurality of wafers in response to pressure being applied to the probe pad.

9. The semiconductor structure according to claim 1 wherein the at least one substrate wafer is a III-V compound semiconductor substrate wafer.

10. The wafer-level package according to claim 1 wherein the at least one substrate wafer is a silicon substrate wafer.

11. A circuit device comprising:
at least one substrate wafer having a first side and a second side, said at least one substrate wafer including an integrated circuit and electrical traces formed on the first side of the at least one substrate wafer, said at least one substrate wafer further including vias extending through the at least one substrate wafer and making electrical contact with the traces, said at least one substrate wafer further including probe pads provided on the second surface of the at least one substrate wafer each being in electrical contact with a via; and
a support post being positioned opposite to a probe pad and in contact with the second surface of the at least one substrate wafer, said support post providing support to resist flexing of the at least one substrate wafer in response to pressure being applied to the probe pad by a probe.

12. The circuit device according to claim 11 wherein the at least one substrate wafer is a plurality of substrate wafers spaced apart from each other defining a multiple vertically stacked structure including cavities between the plurality of wafers, said circuit device further comprising support posts positioned within each cavity in alignment with the probe pad so as to provide support to resist flexing of the plurality of wafers in response to pressure being applied to the probe pad.

13. The circuit device according to claim 11 further comprising another wafer bonded to the substrate wafer, said integrated circuit being positioned between the wafers and said support post being positioned in contact with the another wafer.

14. The circuit device according to claim 13 further comprising a bonding ring that bonds the substrate wafer to the another wafer so that the integrated circuit is positioned within a sealed cavity.

15. The circuit device according to claim 14 wherein the bonding ring and the support post are made of the same material.

16. The circuit device according to claim 15 wherein the support post is part of the bonding ring.

17. The circuit device according to claim 11 wherein the support post is positioned directly beneath three probe pads including two ground pads and a signal pad.

18. A wafer-level package comprising:
a substrate wafer having a first side and a second side, said substrate wafer including at least one integrated circuit and a plurality of electrical traces formed on the first side of the substrate wafer, said substrate wafer further including a plurality of vias extending through the substrate wafer and making electrical contact with the traces, said substrate wafer further including a plurality of probe pads provided on the second surface of the substrate wafer each being in electrical contact with a via;
a cover wafer bonded to the substrate wafer by a bonding ring so as to define a cavity in which the at least one integrated circuit is provided; and
at least one support post being positioned within the cavity directly opposite to a probe pad, said support post being made of the same material and being formed at the same time as the bonding ring, said support post providing support to resist flexing of the substrate wafer from flexing in response to pressure being applied to the probe pad.

19. The wafer-level package according to claim 18 wherein the at least one support post is positioned directly beneath three probe pads including two ground pads and a signal pad.

20. The wafer-level package according to claim 18 wherein the wafer-level package includes a plurality of spaced apart wafers defining cavities therebetween, and at least one support post is at least one support post positioned between wafers in a vertical stacked configuration.

* * * * *